United States Patent
Andreev et al.

(10) Patent No.: US 7,308,633 B2
(45) Date of Patent: Dec. 11, 2007

(54) MASTER CONTROLLER ARCHITECTURE

(75) Inventors: Alexandre Andreev, San Jose, CA (US); Sergey Gribok, Santa Clara, CA (US); Anatoli Bolotov, Cupertino, CA (US)

(73) Assignee: LSI Corporation, Milpitas, CA (US)

( * ) Notice: Subject to any disclaimer, the term of this patent is extended or adjusted under 35 U.S.C. 154(b) by 513 days.

(21) Appl. No.: 10/999,720

(22) Filed: Nov. 30, 2004

(65) Prior Publication Data

US 2006/0129874 A1    Jun. 15, 2006

(51) Int. Cl.
*G01R 31/28* (2006.01)
*G11C 29/00* (2006.01)

(52) U.S. Cl. ...................... 714/733; 714/718
(58) Field of Classification Search ............. 714/733, 714/710, 711, 718
See application file for complete search history.

(56) References Cited

U.S. PATENT DOCUMENTS 5,717,948 A * 2/1998 Michalina ............ 710/1
6,512,709 B1 * 1/2003 Nakahara et al. ........... 365/200
7,216,277 B1 * 5/2007 Ngai et al. ................ 714/733

* cited by examiner

*Primary Examiner*—James C. Kerveros
(74) *Attorney, Agent, or Firm*—Luedeka, Neely & Granham P.C.

(57) ABSTRACT

A master controller for an RRAM subsystem. An interface communicates with at least one RRAM controller. A main control unit selects and implements test and repair operations on the RRAM subsystem through the RRAM controller. A timer determines a maximum number of test and repair operations that can be implemented within a given time. Thus, a master controller is included in the RRAM subsystem. The master controller has a relatively simple interface, and performs test and repair operations on the RRAM subsystem. The advantages of using the master controller include an elimination of additional test ports, simplification of the process of preparing the test vectors for RRAM testing, and the master controller is able to accumulate test results and initiate repairs based on those results. In this manner, the RRAM subsystem has a self-repair functionality.

1 Claim, 8 Drawing Sheets

| Port Name | Port direction | Description |
| --- | --- | --- |
| LOCALRST | Input | Reset Flare contents (set all Flare elements to 0) |
| WE | Input | Write-Enable flag. If 1 then FLARE[A] := BI. |
| ENABLE | Input | Enable flag. If 1 then BO := FLARE[A]. |
| A | Input | Address for reading/writing. |
| BI | Input | New Flare Value. If (WE=1) then FLARE[A] := BI. |
| BO | Output | Outputs current Flare value. If (ENABLE=1) then BO := FLARE[A]. |

Fig. 2

| Port Name | Port direction | Description |
| --- | --- | --- |
| FUSE_IN | Input | Value of FUSE_IN is saved in the chain if FUSE_ENABLE=1 |
| FUSE_SCAN | Input | If FUSE_SCAN=0 and FUSE_READ=1 then load default values to FUSES. If FUSE_SCAN=1 then perform scanning operation |
| FUSE_READ | Input | If FUSE_SCAN=0 and FUSE_READ=1 then load default values to FUSES. |
| FUSE_OUT | Output | Displays value at the end of scan chain |

Fig. 3

| Port Name | Port direction | Description |
| --- | --- | --- |
| WE | Input | Write-Enable flag. If 1 then ParamMaster[A] := DI. |
| A | Input | Address for reading/writing. |
| DI | Input | New ParamMaster Value. If (WE=1) then ParamMaster[A] := DI. |
| DO | Output | Outputs current ParamMaster value. DO := ParamMaster[A]. |

Fig. 4

MASTER CONTROLLER ARCHITECTURE

FIELD

This invention relates to the field of integrated circuits. More particularly, this invention relates to a design for a controller of a memory subsystem within an integrated circuit.

BACKGROUND

Integrated circuits are often formed using an application specific integrated circuit architecture, which tends to reduce the design costs of the integrated circuit by using predetermined logic blocks in a somewhat customized arrangement to produce an integrated circuit according to a customer's specifications. One aspect of such a customizable integrated circuit design is referred to as RRAM.

RRAM (Reconfigurable RAM) contains sets of memories of the same type that are placed compactly within a memory matrix. RRAM also contains sets of embedded tools that are used for mapping arbitrary logical customer memory designs to the physical memories in the matrix. All RRAM memory ports are ports of the customer memories. Ports of memories from the matrix are invisible from the outside of the RRAM. So from the customer's point of view, the RRAM is the set of the customer's memories.

The current strategy of testing the memory matrices is to test every memory of every matrix separately. That testing strategy requires additional ports to the RRAM, especially for all the ports of physical memories. On the other hand, it would be better to prepare different, non-trivial test-vectors for testing every memory.

What is needed, therefore, is an RRAM subsystem that overcomes problems such as those described above, at least in part.

As the term is used herein, "integrated circuit" includes devices such as those formed on monolithic semiconducting substrates, such as those formed of group IV materials like silicon or germanium, or group III-V compounds like gallium arsenide, InP, or mixtures of such materials. The term includes all types of devices formed, such as memory, and all designs of such devices, such as MOS and bipolar.

SUMMARY

The above and other needs are met by a master controller for an RRAM subsystem. An interface communicates with at least one RRAM controller. A main control unit selects and implements test and repair operations on the RRAM subsystem through the RRAM controller. A timer determines a maximum number of test and repair operations that can be implemented within a given time.

Thus, a master controller is included in the RRAM subsystem. The master controller has a relatively simple interface, and performs test and repair operations on the RRAM subsystem. The advantages of using the master controller include an elimination of additional test ports, simplification of the process of preparing the test vectors for RRAM testing, and the master controller is able to accumulate test results and initiate repairs based on those results. In this manner, the RRAM subsystem has a self-repair functionality.

According to another aspect of the invention there is described a master controller for an RRAM subsystem of an integrated circuit. An interface communicates with at least one RRAM controller. A main control unit selects and implements test and repair operations on the RRAM subsystem through the RRAM controller. A timer determines a maximum number of test and repair operations that can be implemented within a given time.

According to yet another aspect of the invention there is described a master controller for an RRAM subsystem of an integrated circuit. An interface communicates with a plurality of RRAM controllers, where each RRAM controller communicates with a given one of a plurality of RRAMs within the RRAM subsystem. A main control unit selects and implements independently implemented test and repair operations on the plurality of RRAMs through the RRAM controllers. A timer determines a maximum number of test and repair operations that can be implemented within a given time on a given one of the plurality of RRAMs.

In various preferred embodiments of the invention according to the aspects described above, the main control unit further selects and implements unique test vectors for different ones of the plurality of RRAM controllers, receives results from the plurality of RRAM controllers in response to the test vectors, and implements unique repair operations based on the results of the test vectors.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein:

FIG. 2 is an annotated list of FLARE ports according to a preferred embodiment of the present invention.

FIG. 3 is an annotated list of FUSES ports according to a preferred embodiment of the present invention.

FIG. 4 is an annotated list of ParamMaster ports according to a preferred embodiment of the present invention.

DETAILED DESCRIPTION

This invention relates to the architecture of a master controller that is disposed inside of a memory subsystem. The architecture according to the preferred embodiment of the invention enables the self test and self repair of the memory subsystem. Therefore, it enables the simplification of the external RRAM interface and the speeding up of the RRAM repair process. The preferred embodiments of the architecture support the parallel test execution scheme. The architecture preferably enables the reduction of the overall test duration by a factor of several times. The architecture is applied to the RRAM module in the embodiments specifically described herein, but it can also be applied to any system that consists of one master controller and several slave controllers.

Figure 1:
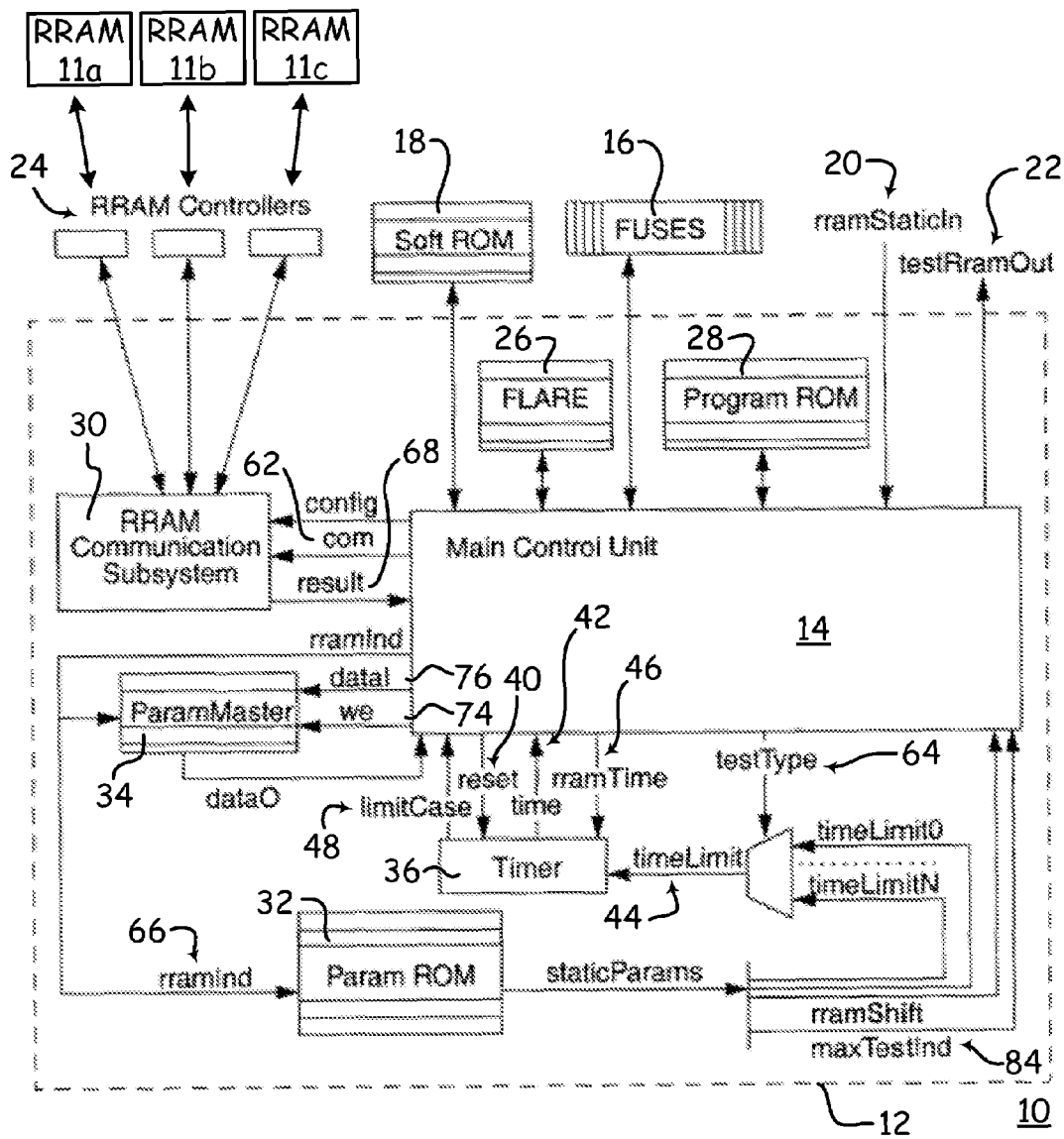
FIG. 1 is a functional block diagram of a master controller module according to a preferred embodiment of the present invention.

With reference now to FIG. 1, the master controller 12, as the term is used herein, is the controller of the RRAM subsystem (including the master controller 12, the RRAM controllers 24, and the RRAM modules 11a-c of the integrated circuit 10. It preferably supports communication with RRAM components, performs different test operations, and directs repair operations. The master controller 12 preferably interacts with the external FUSES 16 and soft ROM 18 modules. The master controller 12 preferably receives external commands through the rramStaticIn port 20, and return results through the testRramOut port 22.

Each of the RRAM controllers 24 can preferably execute different types of tests. The master controller 12 preferably loads test input parameters into each of the RRAM controllers 24, starts execution of the tests, and obtains results of the test execution from the RRAM controllers 24. The test duration preferably depends on the specific RRAM controller 24 that performs the test, and on the type of test being performed. During execution of the tests, the master controller 12 preferably monitors the test statuses as received from of all of the RRAM controllers 24. When one or more of the RRAM controllers 24 finish execution of a test, the master controller 12 preferably starts new tests on the RRAM controllers 24, without interrupting the test process of the other RRAM controllers 24 that have not finished their test routines.

The master controller 12 preferably stores the test results in an inner FLARE memory 26. Every test is preferably associated with some designated portion or memory location of the FLARE memory 26. The master controller 12 preferably includes a simple processor that performs high level commands and generates control sequences for the RRAM controllers 24. The programming for the internal processor is preferably stored in the Program ROM 28. The processor and any additional control logic are preferably placed in the main control unit 14.

Communication between the master controller 12 and the RRAM controllers 24 is preferably accomplished with the RRAM communication subsystem 30. The master controller 12 preferably stores the current test environment for each RRAM controller 24. The master controller is preferably enabled to switch between different RRAM environments in order to communicate with different RRAM controllers 24. During the execution of the tests, the master controller 12 preferably switches rapidly from one RRAM environment to another, checks the test completion, and starts a new test if necessary.

The RRAM environment preferably consists of two main parts. The first part is the static environment. It preferably includes information about the duration of the tests for the given RRAM, and some specific RRAM properties. The static environment is preferably unchangeable. The second part is the dynamic environment. The dynamic environment preferably includes parameters of the current test. During test execution, the master controller 12 preferably changes the dynamic environment for every new test.

The static environment is preferably stored in the Param ROM 32. For each RRAM controller 24, the Param ROM 32 preferably contains a line with a description of all of the static information for the RRAM. The Param ROM 32, Program ROM 28, and soft ROM 18 are preferably general ROMs. The dynamic environment is preferably stored in the ParamMaster module 34. This module 34 preferably provides read and write access to the environment. The master controller 12 preferably finishes the test execution after the expiration of a period of time that is equal to the test duration, which test duration is preferably stored in the Param ROM 32.

A timer module 36 preferably stores information about the current time, such as from the beginning of parallel test execution, and generates signals about time expiration of the current test for the given RRAM environment.

The FLARE module 26 preferably includes a set of registers with associated logic for implementation of a simple memory interface. FIG. 2 presents an annotated list of FLARE ports for one embodiment.

The FUSES module 16 preferably includes a chain of fuse elements. Each fuse element can store a value of zero or one. The chain preferably supports a scanning operation and an operation of loading FUSES with default values. FIG. 3 presents an annotated list of preferred FUSES ports.

The ParamMaster module 34 preferably includes a set of registers with associated logic for simple memory interface realization. FIG. 4 presents an annotated list of preferred ParamMaster ports.

Figure 5:
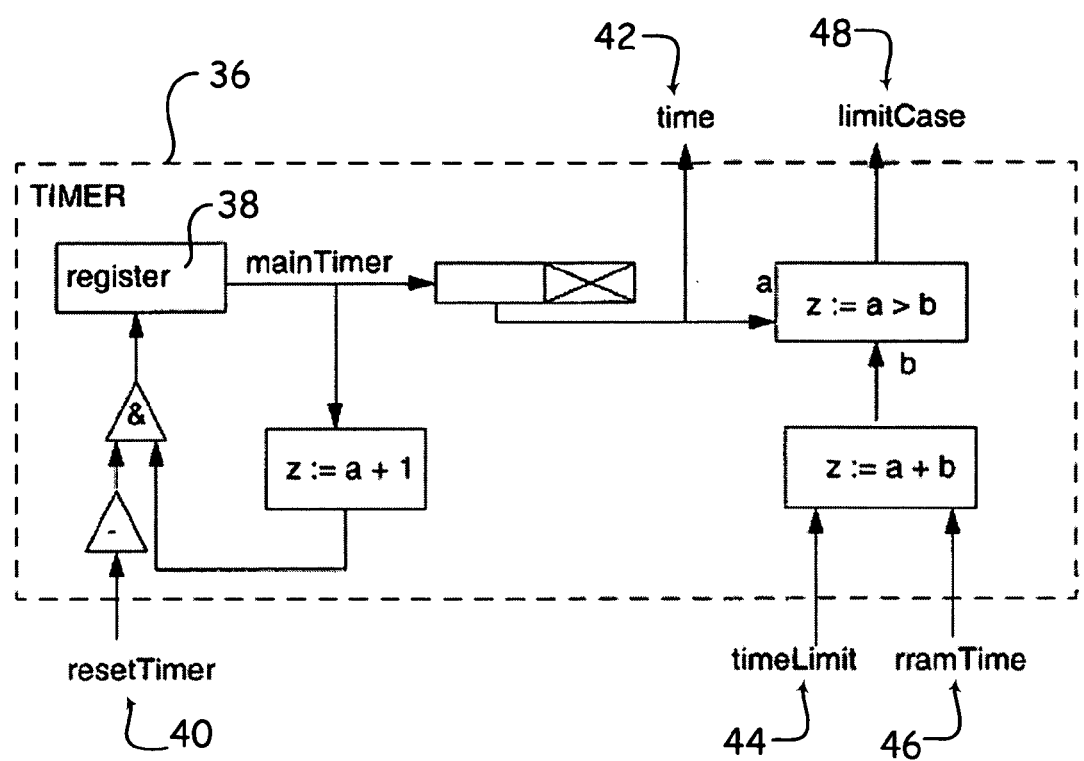
FIG. 5 is a functional block diagram of a timer module according to a preferred embodiment of the present invention.

The timer module 36 is depicted in greater detail in FIG. 5. The timer module 36 preferably includes an inner register 38 that is preferably incremented on every clock cycle. If the value of resetTimer 40 on the input port is one, then the register 38 is preferably set to zero. To reduce module complexity, preferably only the high bits of the register 38 are used in the calculations as described below. Thus, the high bits of the register 38 are preferably output to the time port 42. The timeLimit input port 44 preferably represents the expected duration of the current test. The rramTime input port 46 preferably represents the test start time. Therefore, the sum of these two values preferably represents the expected finish test time. The testLimitCase output port 48 preferably indicates when the current time is greater then the expected test finish time. Most preferably, if the time 42 is greater than the timeLimit 44 plus the rramTime 46, then the limitCase 48 is defined to be one.

Figure 6:
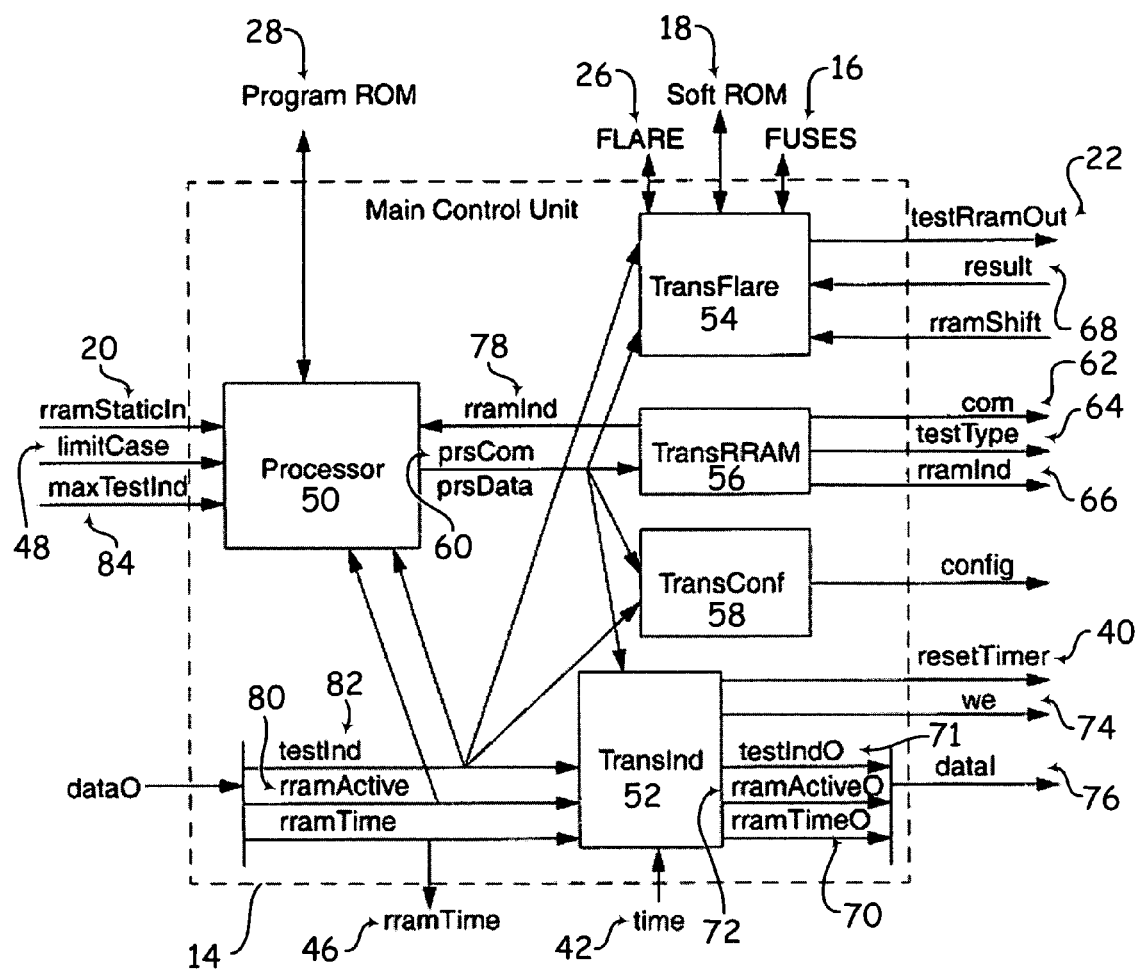
FIG. 6 is a functional block diagram of a main control unit of a master controller module according to a preferred embodiment of the present invention.
Figure 7:
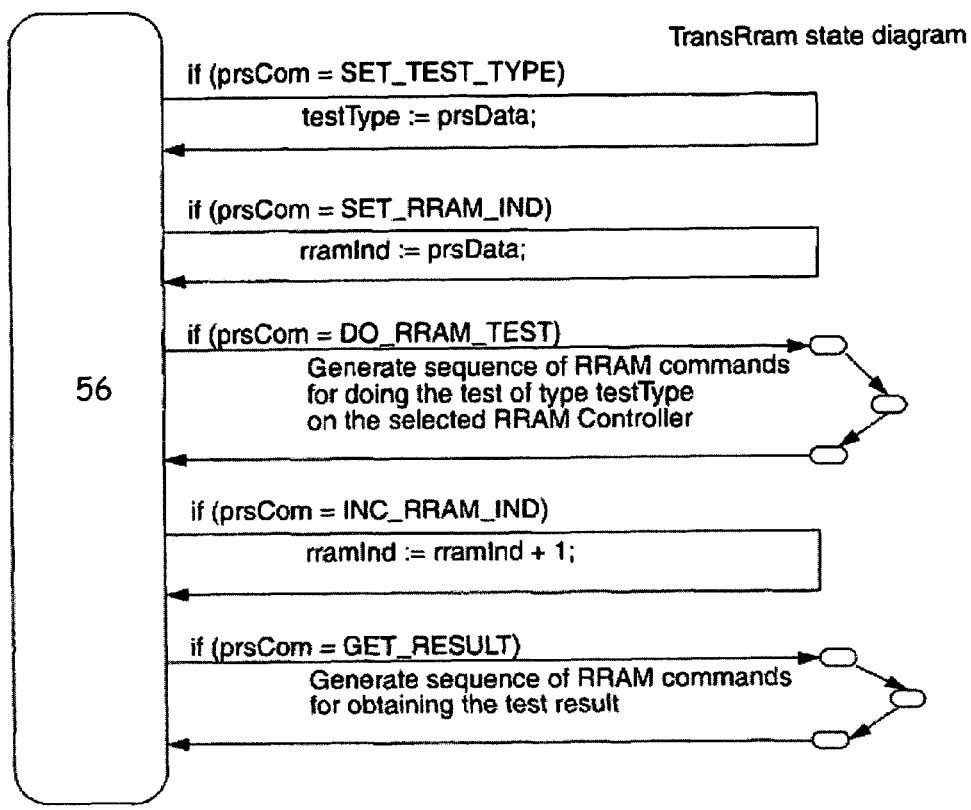
FIG. 7 is a logic diagram of a TransRRAM module according to a preferred embodiment of the present invention.

The core module of the main control unit 14 is the processor module 50, as depicted in FIG. 6. The processor module 50 preferably produces a flow of commands for four dependent modules, which are the TransInd 52, the TransFlare 54, the TransRram 56, and the TransConf 58. The TransConf module 58 is preferably intended to accomplish RRAM configuration and repair. The TransRram module, depicted in greater detail in FIG. 7, is preferably an intermediate module between the processor 50 and the RRAM controllers 24. The TransRram module 56 preferably receives commands 60 from the processor 50 and produces RRAM commands 62. The TransRram module 56 preferably performs several types of commands, as given below:

1) The SET-TEST-TYPE command preferably selects the type of test to be performed. An index of the selected test type is preferably output to the testType port 64.

2) The SET-RRAM-IND command preferably selects the appropriate RRAM controller 24 for further communication. The selected index is preferably output to the rramInd port 66

3) The DO-RRAM-TEST command preferably starts the selected test on the selected RRAM controller 24.

4) The INC-RRAM-IND command preferably increments the current index of the selected RRAM controller 24.

5) The GET-RESULT command preferably generates RRAM controller 24 commands for passing the results of the completed test to the result port 68.

Figure 8:
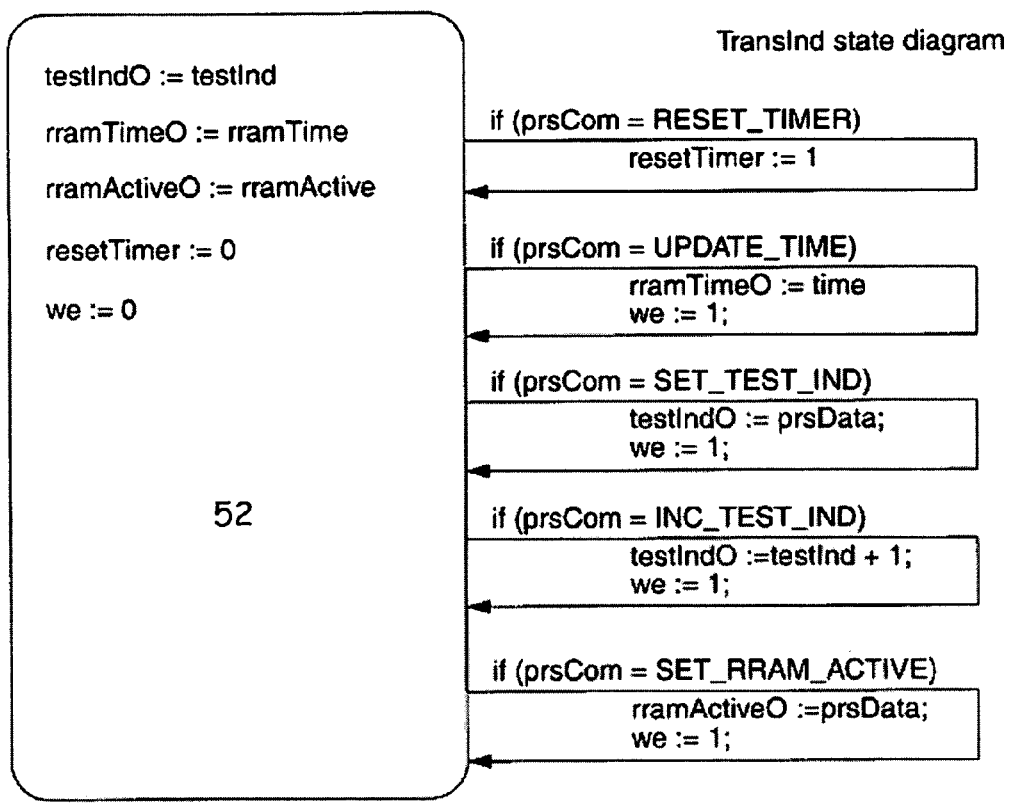
FIG. 8 is a logic diagram of a TransInd module according to a preferred embodiment of the present invention.

The TransInd module 52, depicted in greater detail in FIG. 8, preferably controls the communication between the processor 50 and the ParamMaster module 34 and the Timer module 36. The TransInd module 52 preferably performs several types of commands, as given in more detail below:

1) The RESET-TIMER command preferably passes the resetTimer signal 40 to the Timer module 36.

2) The UPDATE-TIME command preferably sets the value of rramTime 70 to the current value of the time 42.

3) The SET-TEST-INDEX command preferably selects the index of the test to be executed.

4) The INC-TEST-INDEX command preferably increments the index of the test.

The SET-RRAMACTIVE command preferably sets the value of the rramActive flag 72. The selected RRAM controller 24 preferably takes part in the overall process of the parallel test execution if and only if rramActive 72 equals one.

Figure 9:
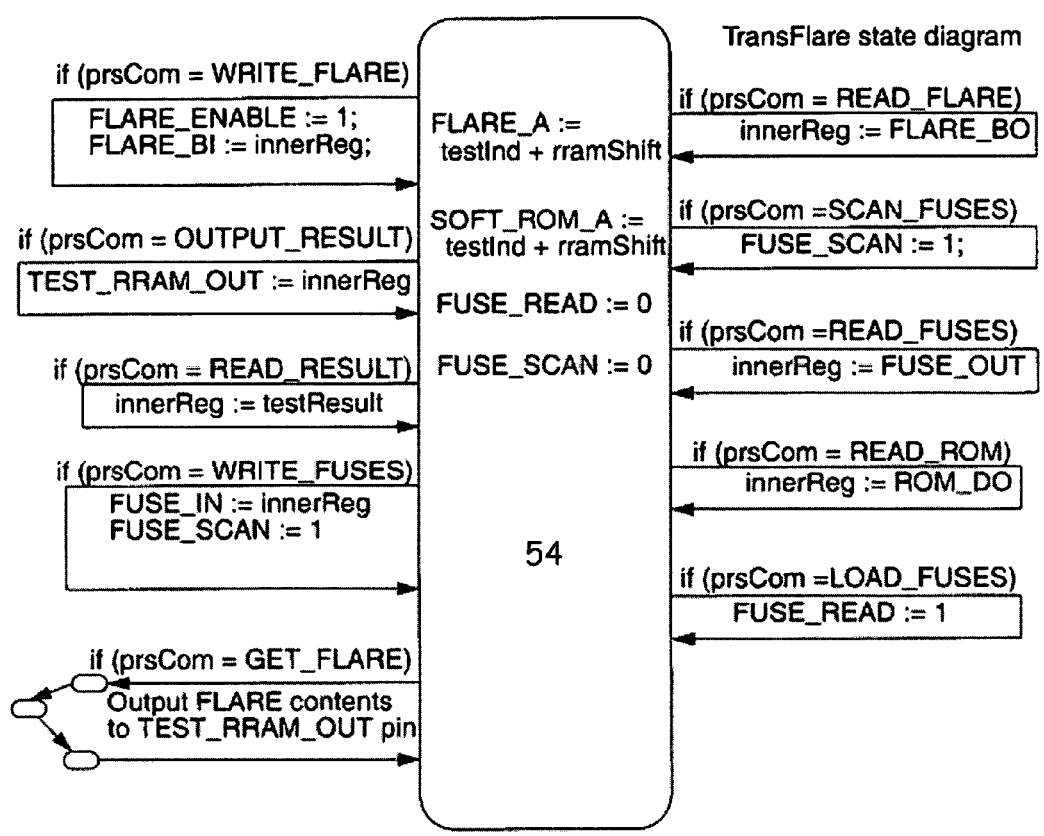
FIG. 9 is a logic diagram of a TransFlare module according to a preferred embodiment of the present invention.

The TransFlare module 54, depicted in greater detail in FIG. 9, preferably enables communication between the processor 50 and the FLARE module 26, the FUSES 16, and soft ROM 18, and outputs the results 68. The TransFlare module 54 preferably performs the commands as given below:

1) The READ-FLARE command preferably reads the value of the FLARE memory 26 and saves it in an inner register.

2) The WRITE-FLARE command preferably writes the value of the inner register into the FLARE module 26.

3) The LOAD-FUSES command preferably loads the default values into the FUSES 16.

4) The READ-FUSES command preferably reads the value of the FUSES 16 and saves it in the inner register.

5) The WRITE-FUSES command preferably writes the value of the inner register into the FUSES 16.

6) The SCAN-FUSES command preferably scans the FUSES chain 16.

7) The READ-SOFT-ROM command preferably reads the value of the soft ROM module 18 and saves it in the inner register.

8) The READ-RESULT command preferably reads the value of the result input 68 and saves it in the inner register.

9) The OUTPUT-RESULT command preferably passes the value of the inner register to the testRramOut port 22.

10) The GET-FLARE command preferably outputs the FLARE module 26 contents to the testRramOut port 22.

Figure 10:
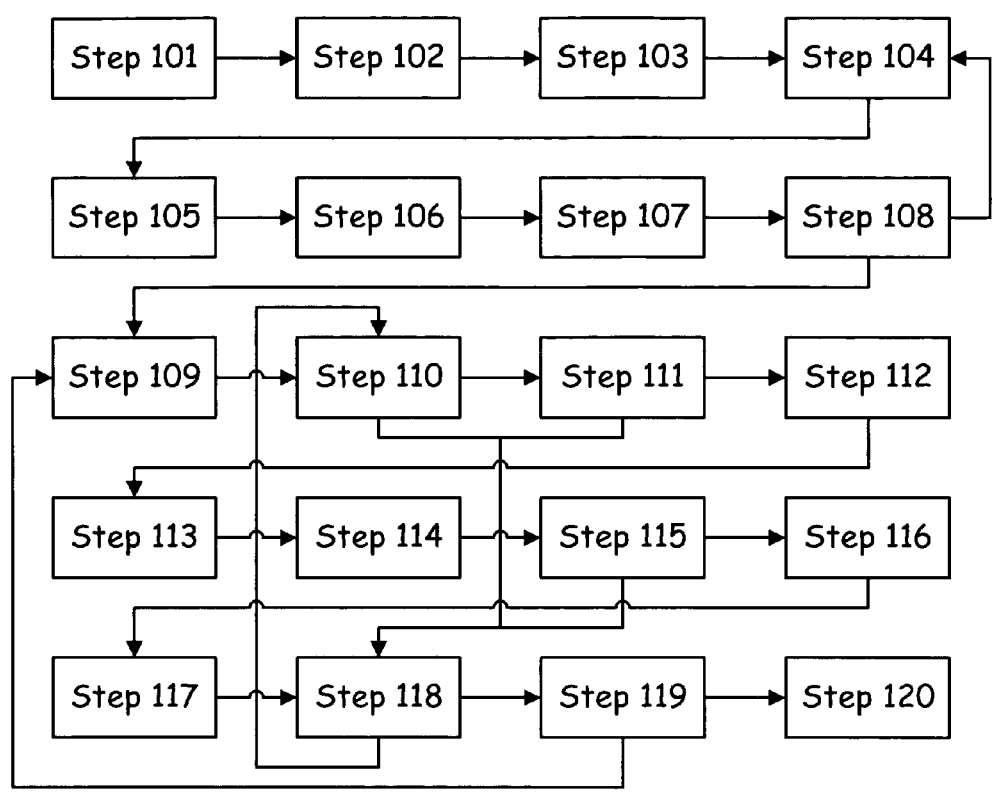
FIG. 10 is a flowchart of a method of using the master controller according to a preferred embodiment of the present invention.

There is next given a description of one embodiment of a parallel RRAM test execution process 100, as given in FIG. 10, considering the overall algorithm of the parallel test execution, and using the architecture described above.

Step 101: The processor 50 produces the SET-TEST-TYPE command. The TransRram 56 performs the command and sets its testType output 64 to the proper value.

Step 102: The processor 50 produces the RESET-TIMER command. The TransInd module 52 performs the command and sets the resetTimer output 40 to one. The timer module 36 sets its time register 38 to zero.

Step 103: The processor 50 generates the SET-RRAM-INDEX(0) command. The TransRram module 56 sets the rramIndex 66 to zero.

Step 104: The processor 50 produces the SET-TEST-INDEX(0) command. The TransInd module 52 sets the testIndex value 71 to zero and sets the we value 74 to one.

The ParamMaster module 34 saves this value of testIndex 71 for the current RRAM controller 24.

Step 105: The processor 50 generates the SET-RRAM-ACTIVE(1) command. The TransInd module 52 sets the value of the rramActive 72 to one and sets the we value 74 to one. The ParamMaster module 34 saves the new value of rramActive 72.

Step 106: The processor 50 generates the UPDATETIME command. The TransInd module 52 updates the value of the rramTime port 46 and sets the we value 74 to one. The ParamMaster module 34 saves the new value of the rramTime 46.

Step 107: The processor 50 generates the DO-RRAM-TEST command. The TransRram module 56 produces a RRAM controller 24 command sequence for starting the selected test on the selected RRAM controller 24.

Step 108: The processor 50 analyzes the current value of rramIndex 78. If it is less then the biggest possible value, then the processor 50 generates the INC-RRAM-INDEX command and returns to step 104. The TransRram module 56 performs this command and increments the value of the rramIndex 66. Otherwise, the processor 50 goes to step 109.

Step 109: The processor 50 generates the SET-RRAM-INDEX(0) command. The TransRram module 56 sets the rramIndex 66 to zero.

Step 110: The processor 50 checks the rramActive value 80. If the rramActive value 80 equals zero, then the selected RRAM controller 24 has already finished execution of all of the tests, and should be omitted. In this case, the processor 50 goes to step 118. Otherwise, it goes to step 111.

Step 111: The processor 50 checks the limitcase value 48. If the limitcase value 48 equals one, then the selected RRAM controller 24 has already finished execution of the current test. If the limitCase value 48 equals zero, then the processor 50 goes to step 118. Otherwise, it goes to Step 112.

Step 112: The processor 50 generates the GET-RESULT command. The TransRram module 56 performs the command and generates the RRAM command sequence 62 for retrieving the result 68 from the RRAM controller 24.

Step 113: The processor 50 sequentially generates the READ-RESULT and the WRITE-FLARE commands. The TransFlare module 54 performs the commands and saves the test result 68 to the FLARE memory 26.

Step 114: The processor 50 compares the testIndex value 82 and the maxTestIndex value 84 from the Param ROM 32. If the testIndex value 82 equals the maxTestIndex value 84, then all of the tests for the given RRAM controller 24 are finished. If so, then the processor 50 increments the number of the RRAM controllers 24 that have finished their test execution, generates the SET-RRAM-ACTIVE(0) command, and goes to step 118. The TransInd module 52 sets the value of the rramactive 72 to zero, and sets the we value 74 to one. The ParamMaster module 34 saves the new value of the rramactive 72.

Step 115: The processor 50 produces the INC-TEST-INDEX command. The TransInd module 52 increments the testIndex value 71 and sets the we value 74 to one. The ParamMaster module 34 saves the new value of the testIndex 71 for the current RRAM controller 24.

Step 116: The processor 50 generates the UPDATE-TIME command. The TransInd module 52 updates the value of the rramTime port 70 and sets the we value 74 to one. The ParamMaster module 34 saves the new value of the rramTime 70.

Step 117: The processor 50 produces the DO-RRAM-TEST command. The TransRram module 56 produces a RRAM controller 24 command sequence for starting the selected test on the RRAM controller 24 with index zero.

Step 118: The processor 50 analyzes the current value of the rramIndex 78. If it is less then the biggest possible value, then the processor 50 generates the INC-RRAM-INDEX command and returns to step 110. The TransRram module 56 performs this command and increments the value of the rramIndex 66. Otherwise, the processor 50 goes to step 119.

Step 119: The processor 50 checks the number of RRAM controllers 24 that have finished their test executions. If some of the RRAM controllers 24 are still working, then the processor 50 goes to step 109, else it goes to step 120.

Step 120: The processor 50 generates the GET-FLARE command. The TransFlare module 54 performs the command and outputs the FLARE 26 contents to the testRramOut port 22.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. In an integrated circuit of the type including an RRAM subsystem, the improvement comprising a master controller for the RRAM subsystem, the master controller including,
   an RRAM communication subsystem for communicating with a plurality of RRAM controllers, where each RRAM controller communicates with a given one of a plurality of RRAMs within the RRAM subsystem,
   a main control unit for selecting and implementing independently implemented test and repair operations on the plurality of RRAMs through the RRAM controllers, and
   a timer for determinig a maximum number of test and repair operations that can be implemented within a given time on a given one of the plurality of RRAMs,
   wherein the main control unit is further adapted to select and implement unique test vectors for different ones of the plurality of RRAM controllers, receive results from the plurality of RRAM controllers in response to the test vectors, and implement unique repair operations based on the results of the test vectors.

* * * * *